(12) United States Patent
Chang

(10) Patent No.: US 7,843,704 B2
(45) Date of Patent: Nov. 30, 2010

(54) PLUGGABLE GUIDING APPARATUS

(75) Inventor: Yin-Lung Chang, Hsinchu (TW)

(73) Assignee: Accton Technology Corporation, Hsinchu (TW)

( * ) Notice: Subject to any disclaimer, the term of this patent is extended or adjusted under 35 U.S.C. 154(b) by 489 days.

(21) Appl. No.: 11/987,034

(22) Filed: Nov. 27, 2007

(65) Prior Publication Data

US 2008/0180920 A1 Jul. 31, 2008

(30) Foreign Application Priority Data

Jan. 30, 2007 (TW) .............................. 96103401 A

(51) Int. Cl.
*H05K 7/14* (2006.01)
(52) U.S. Cl. .................. 361/802; 361/741; 361/756
(58) Field of Classification Search .............. 361/741, 361/756, 802
See application file for complete search history.

(56) References Cited

U.S. PATENT DOCUMENTS

| | | | | |
|---|---|---|---|---|
| 4,896,248 A | * | 1/1990 | Zell et al. ................... | 361/802 |
| 5,767,999 A | * | 6/1998 | Kayner ........................ | 398/164 |
| 5,879,173 A | * | 3/1999 | Poplawski et al. .......... | 439/138 |
| 6,128,196 A | * | 10/2000 | Hoyle et al. ................ | 361/752 |
| 6,166,917 A | * | 12/2000 | Anderson ................... | 361/756 |
| 6,198,633 B1 | * | 3/2001 | Lehman et al. ............. | 361/756 |
| 6,304,436 B1 | * | 10/2001 | Branch et al. ............... | 361/753 |
| 6,580,616 B2 | * | 6/2003 | Greenside et al. ........... | 361/752 |
| 6,661,651 B1 | * | 12/2003 | Tanzer et al. ........... | 361/679.33 |
| 7,177,157 B2 | * | 2/2007 | Aronson et al. ............. | 361/727 |
| 7,327,584 B2 | * | 2/2008 | Ice .............................. | 361/816 |
| 7,499,286 B2 | * | 3/2009 | Berke et al. ................. | 361/756 |
| 2004/0170003 A1 | * | 9/2004 | Chen et al. .................. | 361/741 |

* cited by examiner

*Primary Examiner*—Dameon E Levi
(74) *Attorney, Agent, or Firm*—Rosenberg, Klein & Lee

(57) ABSTRACT

A pluggable guiding apparatus is used for an opening of a case and there are two guiding elements arranged at two sides of the opening. The pluggable guiding apparatus includes: a main frame, wherein the size of the main frame is corresponding to the opening of the case and the main frame is divided into a plurality of sub-slot openings; and a plurality of sub-guiding elements arranged on the main frame, wherein the sub-guiding elements are arranged on two sides of the sub-slot openings, and the sub-guiding elements and guiding elements are set face to face for guiding a plurality of pluggable sub-modules to be inserted into the case.

9 Claims, 7 Drawing Sheets

PLUGGABLE GUIDING APPARATUS

BACKGROUND OF THE INVENTION

1. Field of the Invention

The present invention relates to a network apparatus, and more particularly, to a pluggable guiding apparatus of an extensible and pluggable sub-module used for a network apparatus.

2. Description of the Prior Art

A conventional network device includes a host, a power module, a fan module and an expansion module. There are input/output slots, display lights, and a plurality of serial ports at the rear side of the case. A plurality of openings are defined in the rear side of the case, and then the power module, the fan module and the expansion module can be inserted into the case via those openings to electrically connect to the host of the network device.

Referring to FIG. 1A, there are a power module, a fan module, an expansion module, input/output slots, display lights, and a plurality of serial ports set on the rear side of the case 110 of the network device 100, wherein the expansion module can be a pluggable module 120. Please refer to FIG. 1B, as shown in the figure, the pluggable module 120 can insert into the case 110 via the slot opening 112, and can be led by those guiding elements 130 which are arranged at the sides of the slot opening 112 to insert into case 110. Owing to various network devices, such as the hub, the converter or the router, and according to different demands, there are various specification arrangements. Generally, the manufacturer of those network devices would configure those elements of the network devices according to the clients' demands, and cooperatively manufacture the compatible cases. Hence, if the expansion module is composed of many pluggable modules, the manufacturer must redesign new cases provided with multiple openings in accordance with the change of the specification.

SUMMARY OF THE INVENTION

According to the issue mentioned previously, the present invention is to provide a pluggable guiding apparatus to improve the compatibility and functions of the network device and to reduce the redesigning cost.

One object of the present invention is to provide a pluggable guiding apparatus which utilizes the main frame and a plurality of sub-guiding elements for guiding any one of those pluggable sub-modules to insert into a network apparatus, and in the meantime, there are a plurality of sub-slot openings formed on the main frame.

To achieve the objects mentioned above, one embodiment of the present invention is to provide a pluggable guiding apparatus includes a main frame whose size is corresponding to a opening of a case, wherein the main frame is divided into a plurality of sub-slot openings; and a plurality of sub-guiding elements arranged on the main frame, wherein a portion of sub-guiding elements and any one of those guiding elements arranged at two sides of the opening of the case are set face to face for guiding a plurality of pluggable sub-modules to insert into the case.

To achieve the objects mentioned above, another embodiment of the present invention is to provide a network apparatus, including: a case provided with at least an opening; two guiding elements arranged at two sides of the opening of the case for guiding a pluggable module to insert into the case; and a pluggable guiding apparatus set on the opening of the case. The pluggable guiding apparatus includes: a main frame whose size is corresponding to the opening of the case, wherein the main frame is divided into a plurality of sub-slot openings; and a plurality of sub-guiding elements arranged on the main frame, wherein a portion of sub-guiding elements and any one of the guiding elements of the case are set in pairs for guiding a plurality of pluggable sub-modules to insert into the case.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
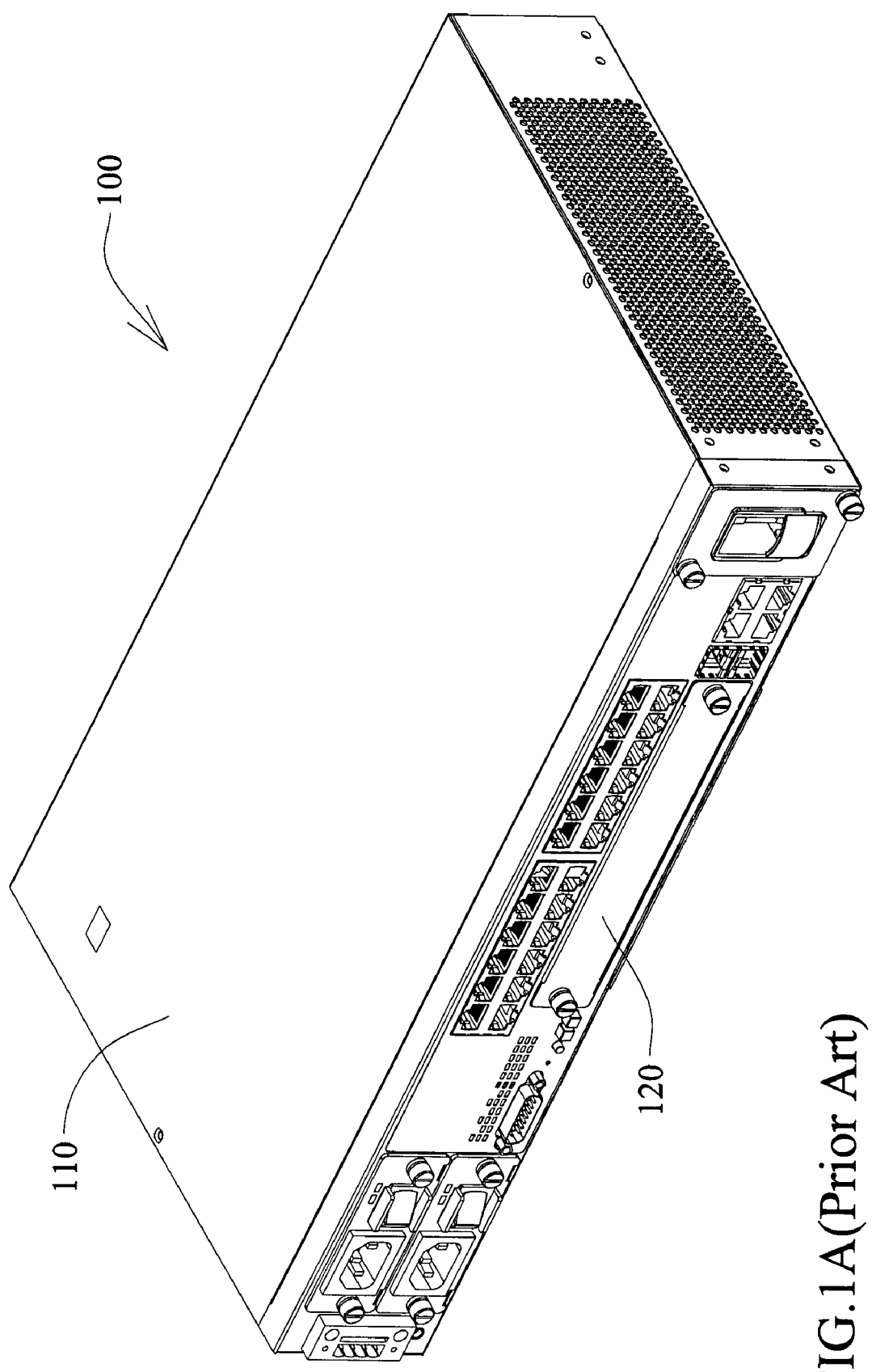
FIG. 1A is the schematic diagram to illustrate the conventional network device.
Figure 1B:
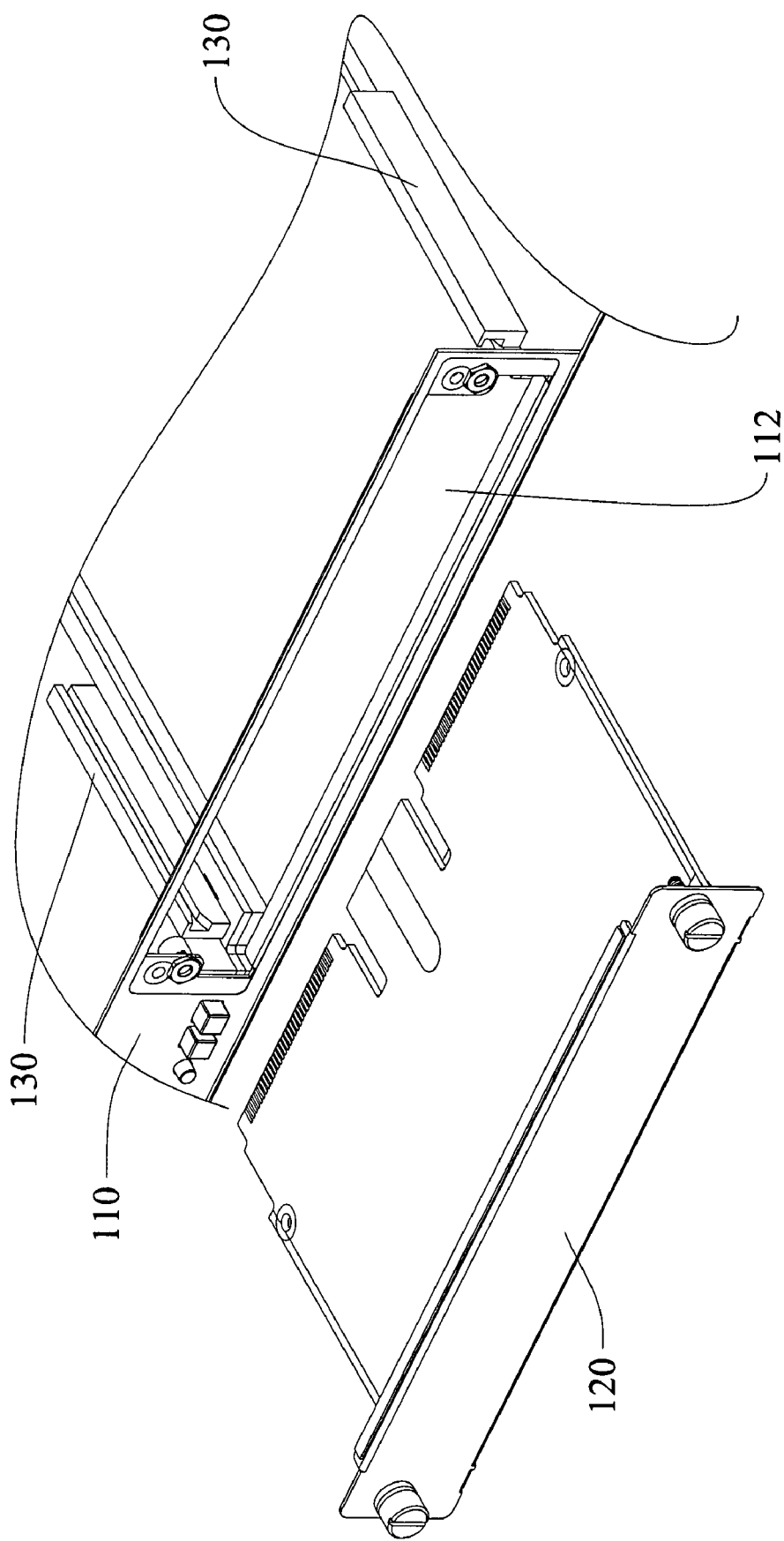
FIG. 1B is the partially-exposed schematic diagram to illustrate the conventional network device.
Figure 2A:
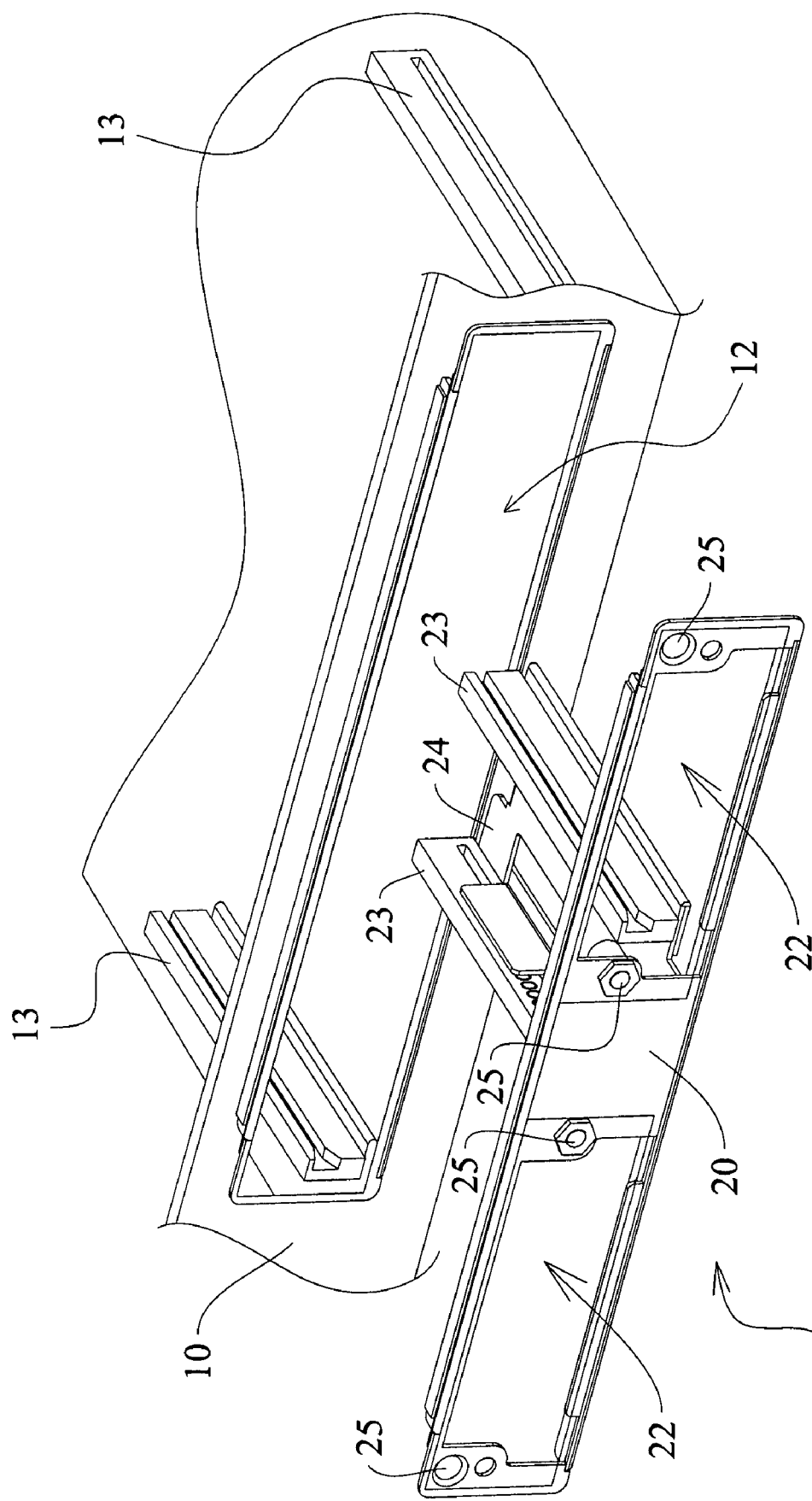
FIG. 2A and FIG. 2B are the schematic diagrams according to one embodiment of the present invention.
Figure 2B:
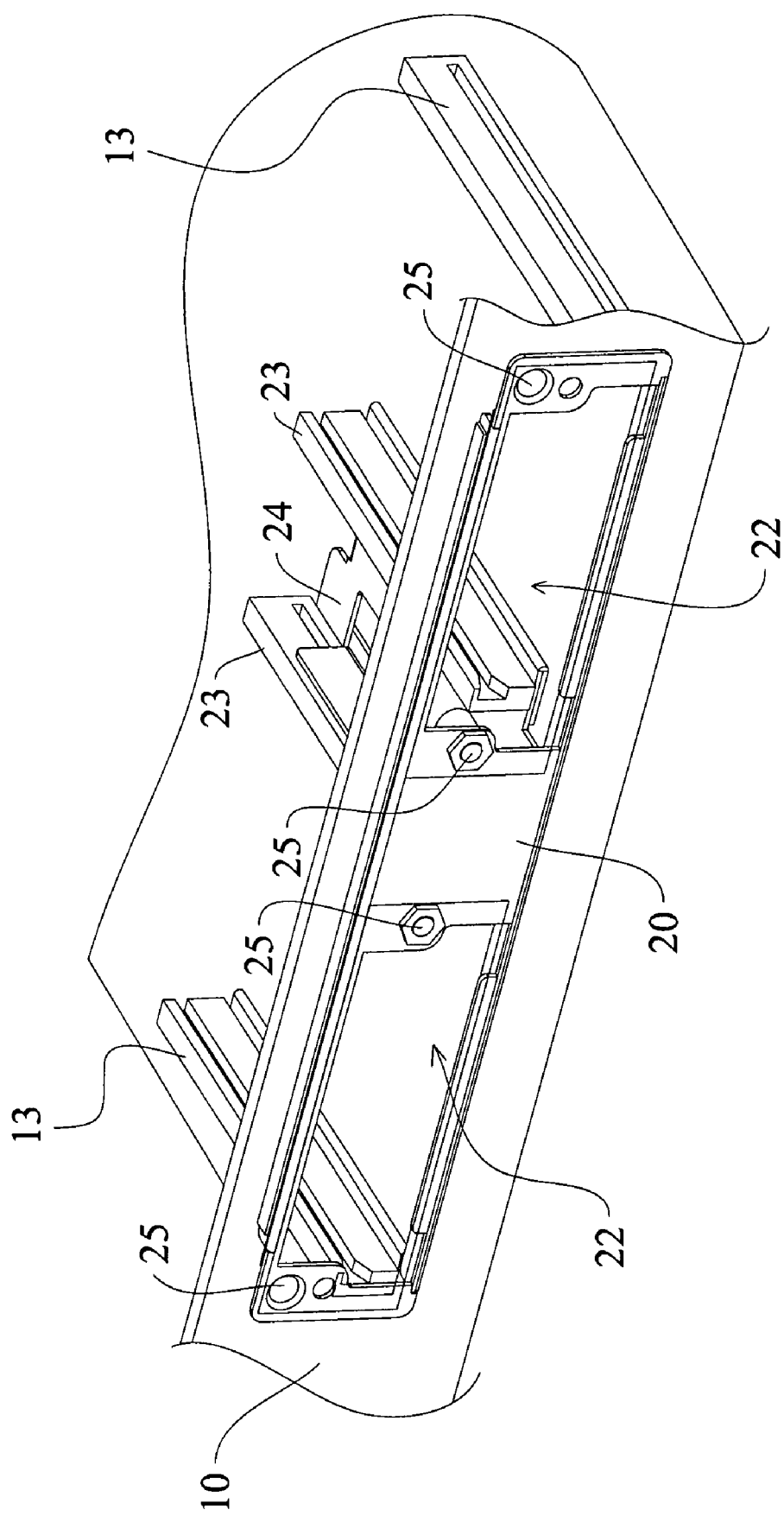

Firstly, FIG. 2A and FIG. 2B are the schematic diagrams according to one embodiment of the present invention. Referring to FIG. 2A, in this embodiment, a pluggable guiding apparatus 200 is applied to an opening 12 of a case 10. It just illustrates a portion of perspective drawing of the case 10 in FIG. 2A. In addition, two guiding elements 13 are arranged within the case 10 at two sides of the opening 12. The pluggable guiding apparatus 200 includes a main frame 20 whose size is corresponding to the opening 12 of the case 10 and a plurality of sub-slot openings 22 formed on the main frame 20. A plurality of sub-guiding elements 23 are arranged on the main frame 20, wherein those sub-guiding elements 23 are set on a bearing plate 24 extending from the main frame 20. In one embodiment, the bearing plate 24 comprises an engaging element (not shown in the figure) so as to engage with the case 10.

Following the above description, referring to FIG. 2B, those sub-guiding elements 23 of the main frame 20 and those guiding elements 13 of the case 10 are set face to face to guide a plurality of pluggable sub-modules (not shown). In the embodiment, the pluggable sub-modules can be inserted into the case 10. There are a plurality of lock-holes 25 formed on the main frame 20 for the pluggable sub-modules to fasten within those sub-slot openings 22 when those pluggable sub-modules are inserted into the case 10.

Figure 3:
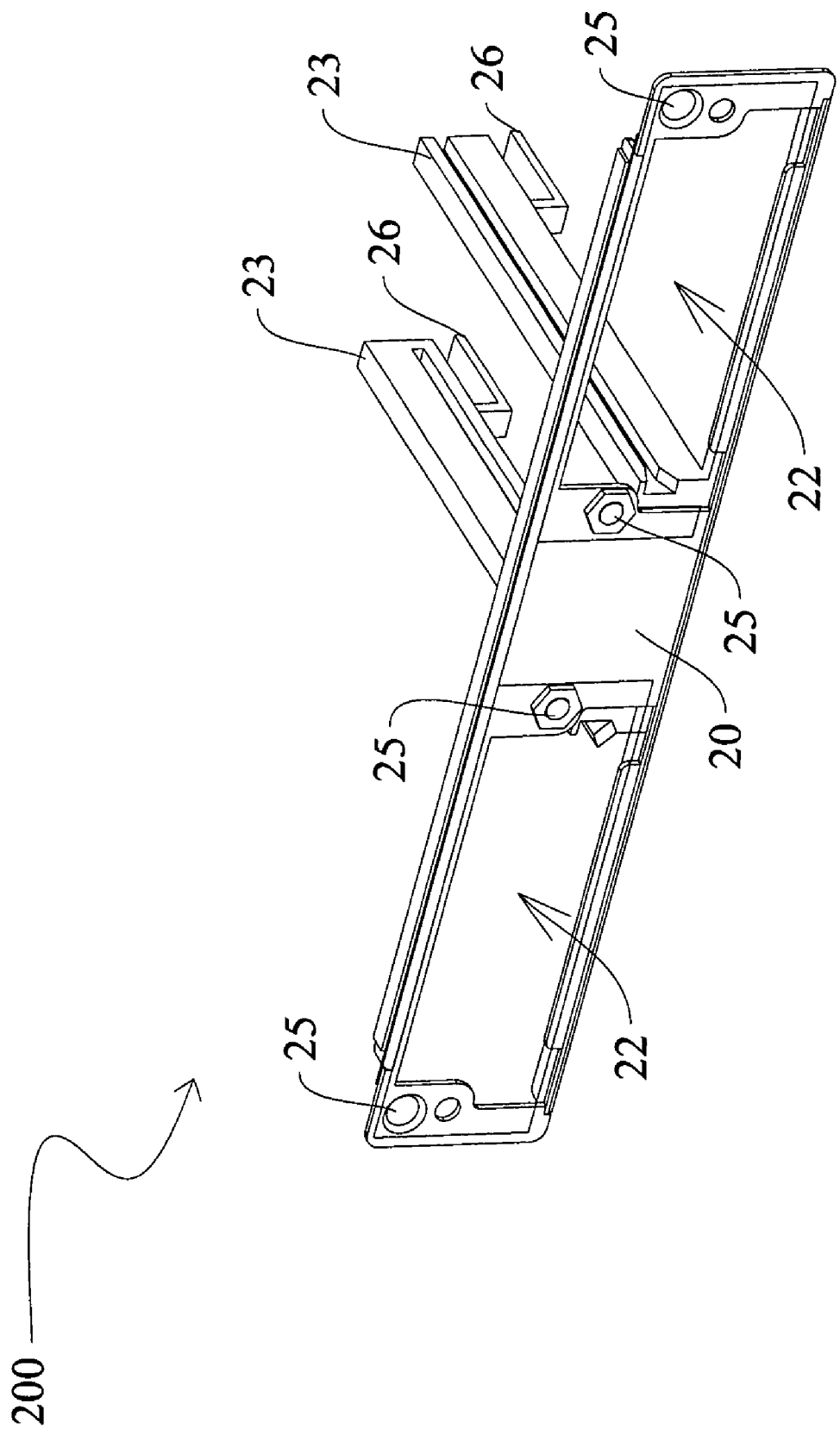
FIG. 3 is the schematic diagram according to another embodiment of the present invention.

Referring to FIG. 3, in an embodiment, those sub-guiding elements 23 and the main frame 20 of the pluggable guiding apparatus 200 are formed in one-piece.

In another embodiment, not shown in the figure, those sub-guiding elements 23 and the main frame 20 can be engaged with each other as well, and those sub-guiding elements 23 can be set in corresponding position according to the size and the amount of the pluggable sub-modules. As shown in FIG. 2B, those guiding element 13 and those sub-guiding elements 23 can be designed as guiding rails, guiding grooves, or their combination; additionally, they can be sliding rails, sliding grooves, or their combination. Those sub-guiding elements 23 can further be provided with an engaging element 26. Such as the hook workpiece, the engaging element 26 can be utilized to engage the sub-guiding elements 23 with the case 10. Besides, the engaging element 26 can be set on the end of the sub-guiding elements 23 or any other appropriate position.

In the fore mentioned embodiment, such as shown in FIG. 2A and FIG. 2B, there are two sub-slot openings 22 formed on the main frame 20, and those sub-guiding elements 23 of the main frame 20 and those guiding elements 13 of the case 10 are set face to face. However, the present invention is not limited by the one shown in the figure. When there are more than two sub-slot openings, the sub-guiding elements can be set at two sides of the sub-slot openings to lead a plurality of pluggable sub-modules as well.

Figure 4A:
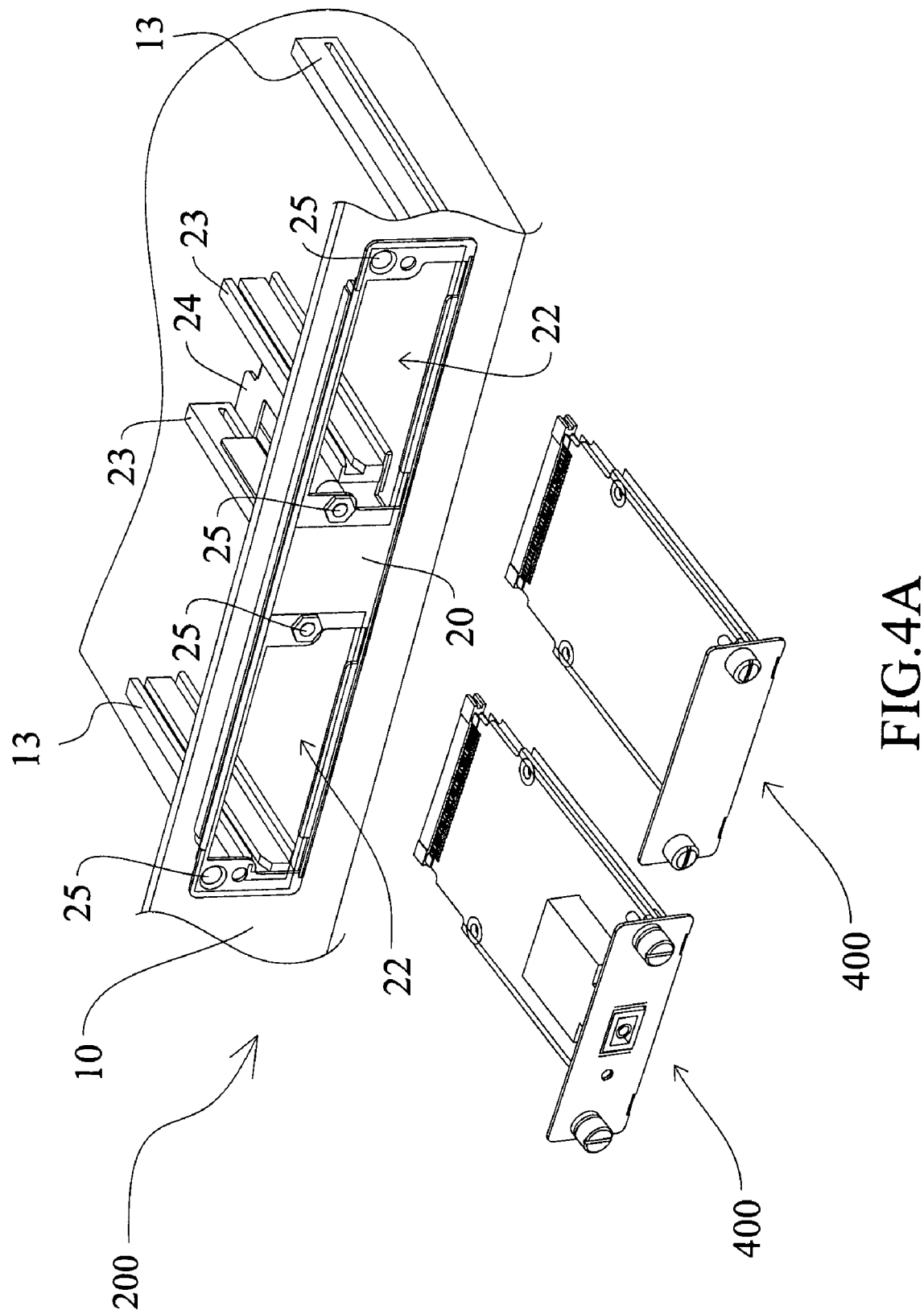
FIG. 4A and FIG. 4B are the schematic diagrams according to another one embodiment of the present invention.
Figure 4B:
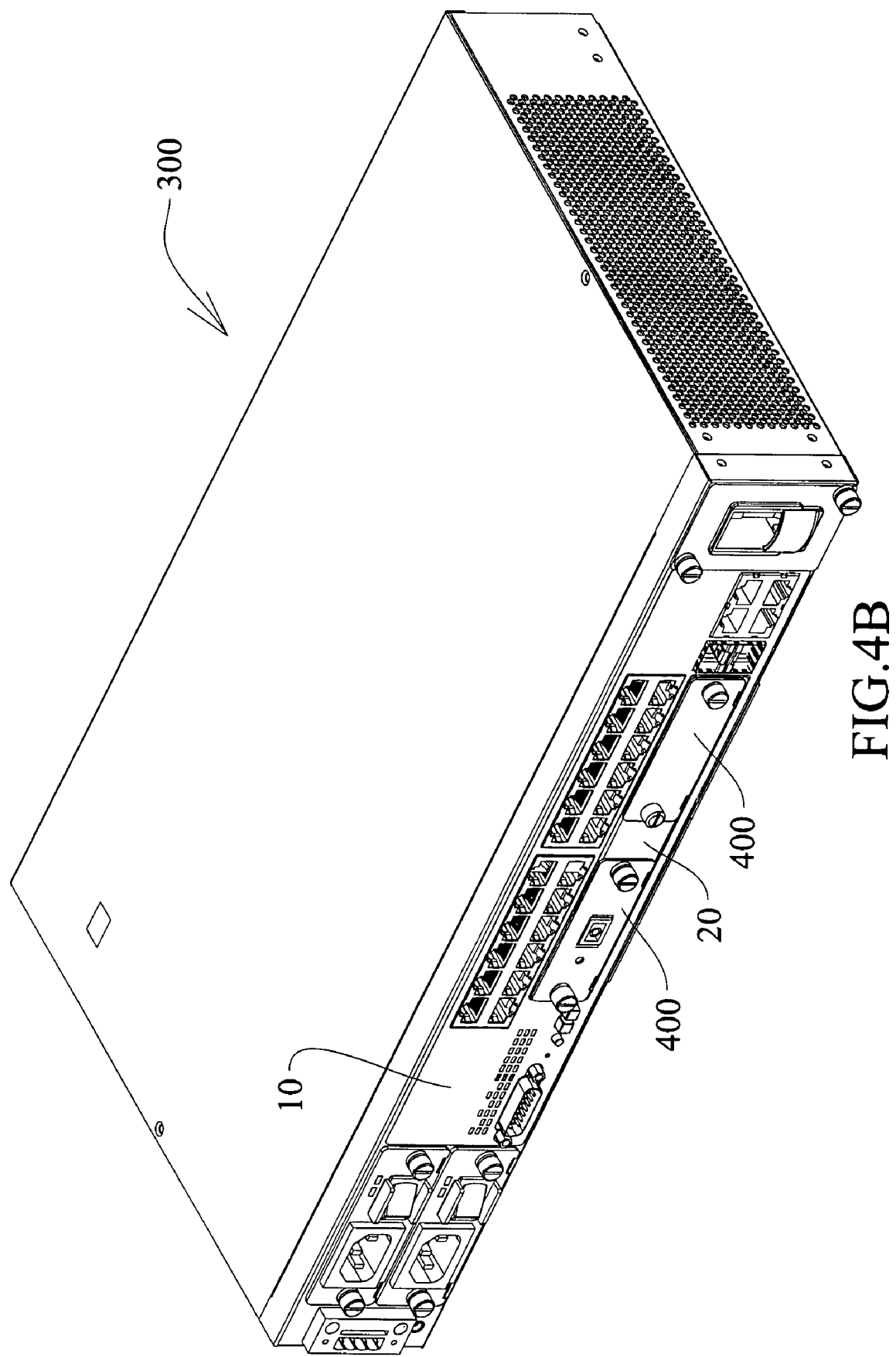

Continuously, referring to FIG. 4A and FIG. 4B, FIG. 4A and FIG. 4B are the schematic diagrams according to another embodiment of the present invention. The case 10 has at least an opening. Two guiding elements 13 set at two sides of the opening of the case 10 for guiding a pluggable sub-module 400 to insert into the case 10.

A pluggable guiding apparatus 200 are set in the opening of the case 10. The pluggable guiding apparatus 200 includes a main frame 20 having a plurality of sub-slot openings 22 and a plurality of sub-guiding elements 23, wherein the size of the main frame 20 is corresponding to the opening of the case 10, and those sub-slot openings 22 are formed on the main frame 20. A plurality of sub-guiding elements 23 are set on the main frame 20, wherein those guiding elements 13 are set at two sides of the opening of the case 10 and those sub-guiding elements 23 of the main frame 20 are set in pairs for guiding a plurality of pluggable sub-modules 400 to be inserted into the case 10 and fasten together by utilizing the lockholes on the main frame 20. Moreover, the pluggable sub-modules 400 can be electrically connected to the host of the network apparatus 300.

According to the above description, one of the features of the present invention is to utilize the conventional opening of the case to design a pluggable guiding apparatus. Additionally, the main frame forms the appropriate sub-slot openings according to the size and amount of the openings. Further, the sub-guiding elements of the main frame are set to be integrated with the guiding elements at two sides of the opening of the case for guiding the pluggable sub-modules to insert into the case. According to various design of the network apparatus, the identical case also can be utilized to cooperate with different pluggable guiding apparatus. Besides, the opening of the case can be designed to meet different demands for plenty of different pluggable sub-modules to insert into the case.

To summarize, the present invention utilizes the main frame cooperated with a plurality of sub-guiding elements and a plurality of sub-slot openings formed on the main frame to integrate with the case of the network apparatus so as to improve the compatibility and functions of the network apparatus and to reduce the redesigning cost.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A network apparatus, comprising:
   a case provided with at least an opening;
   two guiding elements arranged at two sides of said opening of said case for guiding a pluggable module to be inserted into said case; and
   a pluggable guiding apparatus correspondingly set on said opening of said case, and said pluggable guiding apparatus comprising:
   a main frame whose size is corresponding to said opening of said case, wherein said main frame is divided into a plurality of sub-slot openings; and
   a plurality of sub-guiding elements arranged on said main frame, wherein a portion of said sub-guiding elements and any one of said guiding elements of said case are set face to face for guiding a plurality of pluggable sub-modules to insert into said case.

2. The network apparatus according to claim 1, wherein said sub-guiding elements are arranged on a bearing plate extending from said main frame.

3. The network apparatus according to claim 2, wherein said bearing plate engages with said case with an engaging element.

4. The network apparatus according to claim 1, wherein every one of said sub-guiding elements of said main frame engages with said case with an engaging element.

5. The network apparatus according to claim 1, wherein said sub-guiding elements and said main frame are one-piece form.

6. The network apparatus according to claim 1, wherein said sub-guiding elements and said main frame are engaged with each other.

7. The network apparatus according to claim 1, wherein a plurality of lockholes are set on said main frame.

8. The network apparatus according to claim 1, wherein a portion of said sub-guiding elements of said main frame are set in pairs at two sides of any one of said sub-slot openings.

9. The network apparatus according to claim 1, wherein said sub-guiding elements are guiding rails, guiding grooves, sliding rails, or sliding grooves.

* * * * *